United States Patent
Chien

(10) Patent No.: US 6,405,331 B1
(45) Date of Patent: Jun. 11, 2002

(54) METHOD FOR PERFORMING A BUILT-IN SELF-TEST PROCEDURE ON EMBEDDED MEMORY DEVICE

(76) Inventor: Pien Chien, No. 144, Chi-Long Rd. Sec. 3, Taipei (TW)

(*) Notice: Subject to any disclaimer, the term of this patent is extended or adjusted under 35 U.S.C. 154(b) by 0 days.

(21) Appl. No.: 09/359,448

(22) Filed: Jul. 22, 1999

(30) Foreign Application Priority Data

May 11, 1999 (KR) .......................................... 088107586

(51) Int. Cl.[7] .............................................. G11C 29/00

(52) U.S. Cl. .................... 714/718; 714/733; 365/200; 365/201

(58) Field of Search ................................ 714/718, 733; 365/200, 201; 370/314

(56) References Cited

U.S. PATENT DOCUMENTS 4,514,830 A * 4/1985 Hagiwara et al. ........... 365/200
6,182,257 B1 * 1/2001 Gillingham .................. 714/733

* cited by examiner

Primary Examiner—Phung M. Chung
(74) Attorney, Agent, or Firm—J. C. Patents

(57) ABSTRACT

A method is provided for performing a BIST (built-in self test) procedure on embedded memory through a time-division multipexed scheme with a reduced number of probing pads. This method is characterized in the use of a time-division multipexed scheme to obtain the addresses of bad memory cells so that these address data can be used to indicate the locations of the bad memory cells during repair process. Moreover, this method is characterized in that it requires only a fewer number of probing pads than the prior art so that the required layout area for the BIST procedure can be reduced as compared to the prior art. This method is therefore more cost-effective to implement than the prior art.

10 Claims, 4 Drawing Sheets

US 6,405,331 B1

METHOD FOR PERFORMING A BUILT-IN SELF-TEST PROCEDURE ON EMBEDDED MEMORY DEVICE

CROSS-REFERENCE TO RELATED APPLICATION

This application claims the priority benefit of Taiwan application serial no. 88107586, filed May 11, 1999, the full disclosure of which is incorporated herein by reference.

BACKGROUND OF THE INVENTION

1. Field of the Invention

This invention relates to integrated circuit (IC) memory testing methodology, and more particularly, to a method of performing a BIST (built-in self test) procedure on embedded memory through a time-division multipexed scheme with a reduced number of probing pads.

2. Description of Related Art

Due to advances in IC fabrication technology, it is today a typical practice to integrate both a data processing unit and a memory unit on the same chip. Such a memory unit is customarily referred to as embedded memory. As embedded memory is increased in capacity, however, it would cause problems in operation to the associated ASIC (Application-Specific Integrated Circuit) and logic circuits. Moreover, it would be difficult for memory testers to test high-capacity embedded memory units since most existing memory testers are old-fashioned with a low-speed clock rate that can be hardly used for the testing of high-speed memory devices.

For low-capacity embedded memory units, it would be sufficient to perform testing on them in a cost-effective manner without having to use BIST or gang probing techniques. However, system-on-chip is a major trend in IC design and fabrication, and the embedded memory should be high in speed and large in capacity and word length. Conventionally, BIST method is used for the testing of embedded memory. However, BIST method lacks repair capability so that bad memory cells can not be automatically repaired. Today's embedded memory has now reached a capacity in the range from 16 MB to 32 MB. Typically, embedded memory chips with built-in repair capability is about 5% to 30% larger in size than those with BIST but no repair capability since more layout area is required to incorporate the repair capability. One type of embedded memory utilizes probing method to detect and repair bad memory cells. One drawback to this method, however, is that it would be unsuitable for use on embedded memory with a large word length. Moreover, it would require a large layout area on the chip to incorporate the required probing pads.

FIG. 1 is a schematic block diagram of a conventional BIST circuit used to test an embedded memory unit 60. The BIST circuit includes an ATPG_A (Automatic Test Pattern Generator for Address) unit 30 and an ATPG_D (Automatic Test Pattern Generator for Data) unit 40. The test procedure performed by the BIST circuit is shown in FIG. 2. When the BIST-EN (BIST-enable) pad 10 receives an enable signal, it activates the BIST logic unit 20 to issue a request for a write cycle, which causes the ATPG_A unit 30 to generate an address signal and the ATPG_D unit 40 to generate a block of test data. The data generated by the ATPG_D unit 40 are then stored in the storage area 64 of the embedded memory unit 60 at the address specified by the ATPG_A unit 30. The read/write operation on the embedded memory unit 60 is controlled by the ASIC device 50. During a read cycle, the memory I/O unit 66 retrieves the test data that were previously stored into the storage area 64 of the embedded memory unit 60 at the address specified by the ATPG_A unit 30. The retrieved data are then forwarded to the comparator 70, where the retrieved data are compared in a bit-by-bit manner with the originally-generated test data from the ATPG_D unit 40. If all bits are OK, the comparator 70 generates a first logic signal, for example 0, indicative of such a condition; otherwise, the comparator 70 generates a second logic signal, for example 1, which causes the OR gate 80 to perform an OR-operation on the test data. If the OR gate 80 outputs 0, it indicates that all the memory cells are all correct; otherwise, if 1, it indicates that at least one memory cell in the embedded memory unit 60 is bad.

The output of the OR gate 80 is then outputted via the PASS/FAIL pad 90 to external circuitry (not shown). The condition of the output being 0 indicates PASS; whereas the condition of the output being 1 indicates FAIL. If a FAIL signal is received, the entire embedded memory unit 60 will be discarded.

A conventional method for repairing bad memory cell is to provide a bit-mapping memory tester to the embedded memory unit, which includes a cache memory unit with the same capacity as the embedded memory unit, and is capable of repairing a bad memory cell by mapping the address of the bad memory cell to the cache memory. One draw-back to this solution, however, is that when the embedded memory is quite large in capacity, it would make the use of cache memory quite costly to implement. Moreover, when word length is large, it will require a large number of probing pads on the memory chip, and thus a large layout area to incorporate these probing pads, which makes it quite costly to implement.

SUMMARY OF THE INVENTION

It is therefore an objective of this invention to provide a new method for performing a self-test on an IC memory device, which utilizes a time-division multipexed scheme to detect bad memory cells in a more efficient manner.

It is another objective of this invention to provide a method for performing a self-test on an IC memory device, which can help reduce the number of required probing pads on the memory chip to save cost.

In accordance with the foregoing and other objectives of this invention, a new method is provided for performing a BIST procedure on embedded memory. The method of the invention includes the following procedural steps: (1) generating a block of test data; (2) performing a write operation to write the test data into a specified address in the embedded memory; (3) performing a read operation to retrieve the test data from the embedded memory; (4) comparing the retrieved test data with the originally-generated test data; and (5) if any bit is mismatched, outputting a sequence of blocks of error bits indicative of the bad memory cells in the embedded memory, if any; the length of each error-bit block being an integer division of the word length of the embedded memory, and the sequence of error-bit blocks being transferred in a time-division multipexed scheme via a plurality of probing pads equal in number to the length of the error-bit block.

The foregoing method is characterized in the use of a time-division multipexed scheme to obtain the addresses of bad memory cells so that these address data can be used to indicate the locations of the bad memory cells during repair process. Moreover, the invention is characterized in that it requires only a fewer number of probing pads than the prior art so that the required layout area for the BIST procedure can be reduced as compared to the prior art. The invention is therefore more cost-effective to implement than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
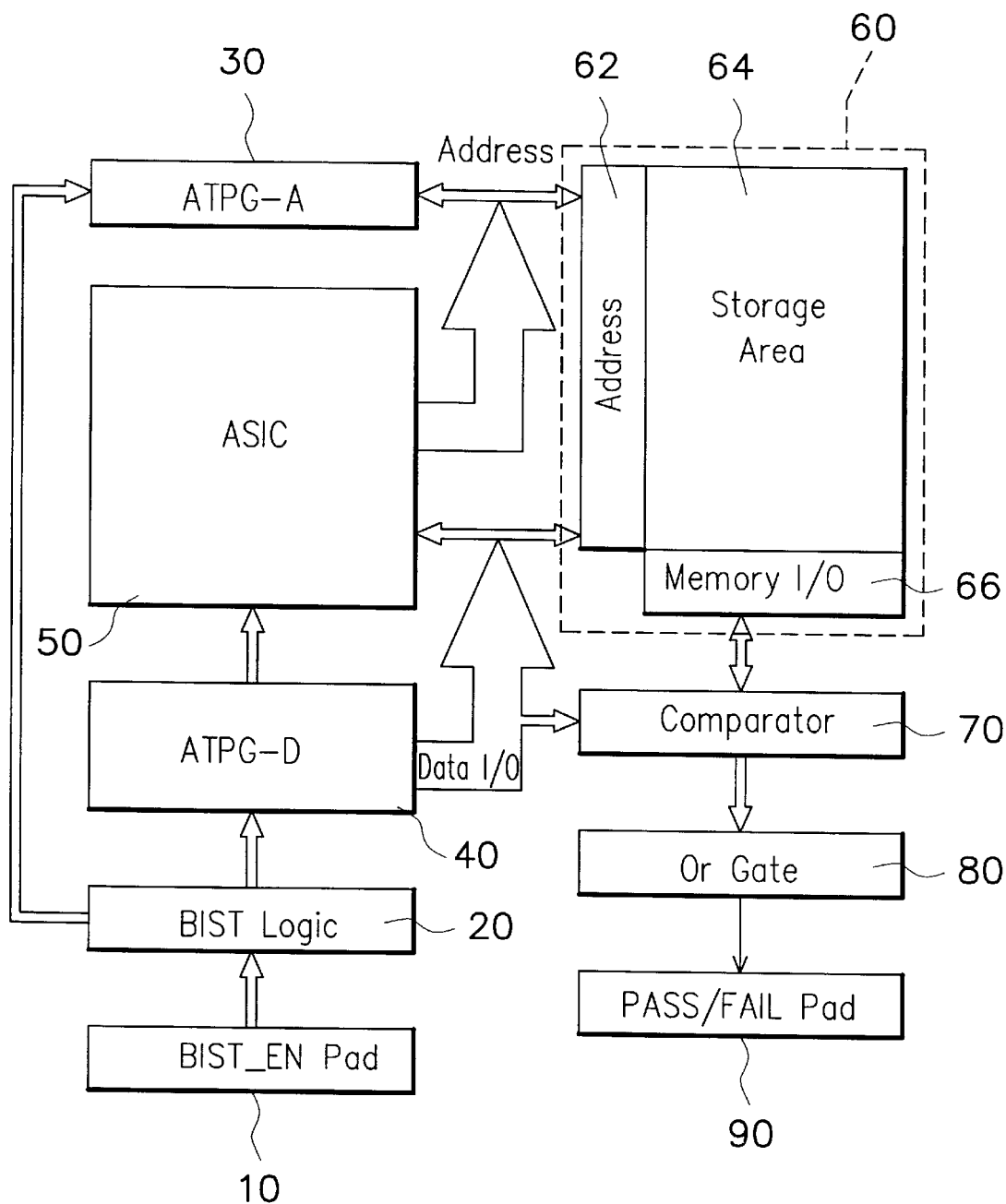
FIG. 1 (PRIOR ART) is a schematic block diagram of a conventional BIST circuit coupled to an embedded memory unit for BIST testing.
Figure 2:
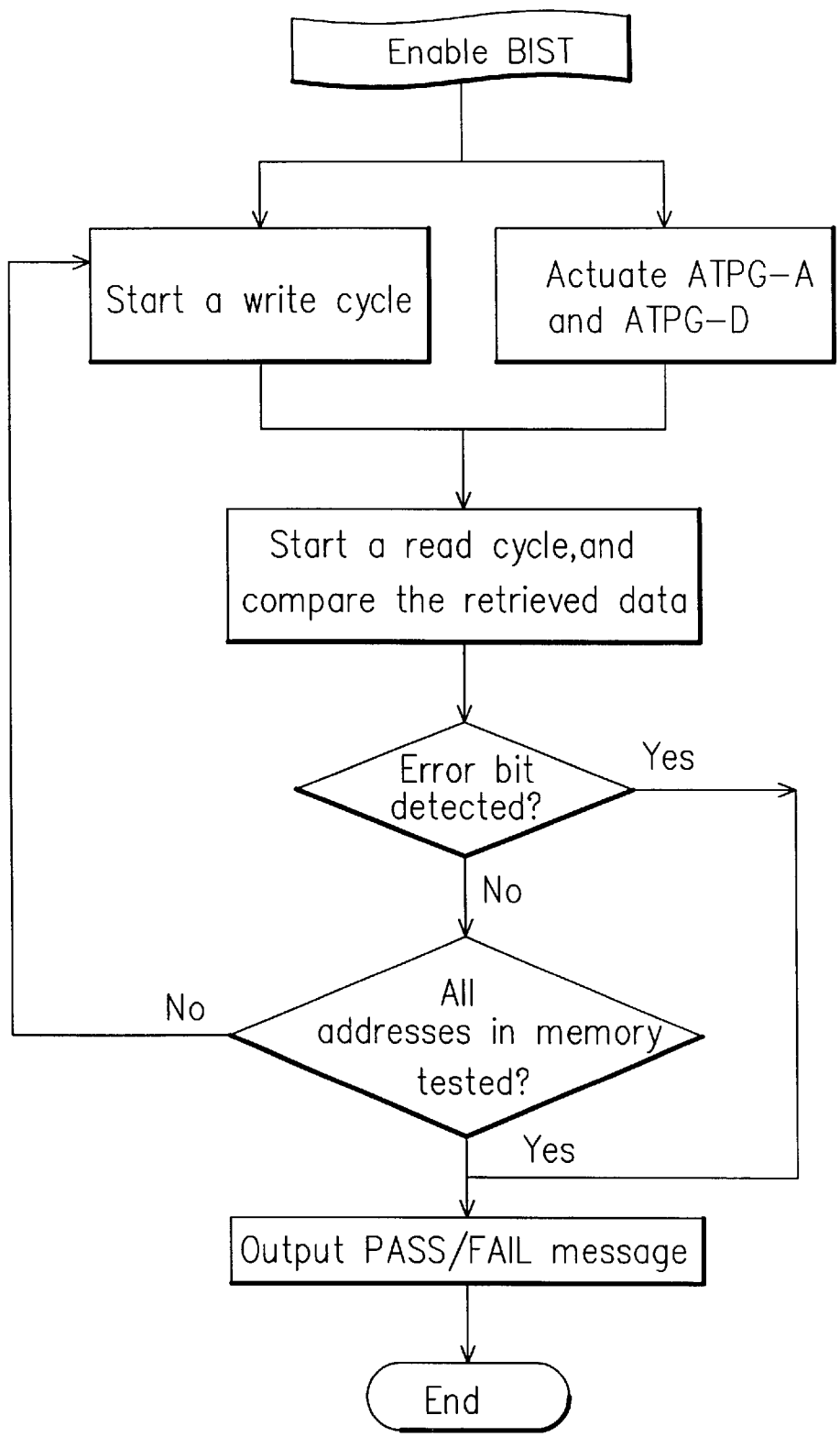
FIG. 2 (PRIOR ART) is a flow diagram showing the steps involved in the BIST procedure performed by the BIST circuit shown in FIG. 1.
Figure 3:
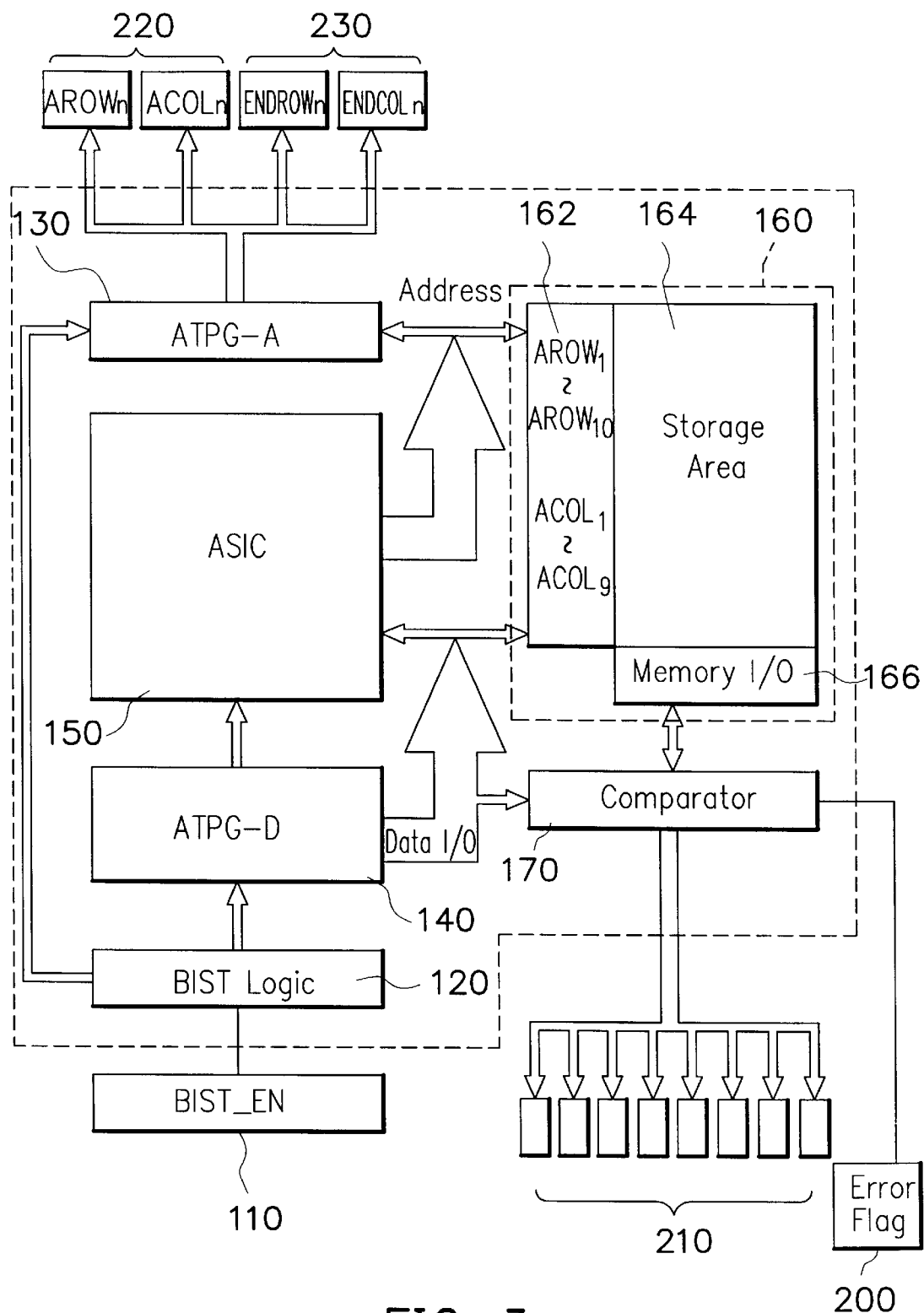
FIG. 3 is a schematic block diagram of the present invention BIST circuit coupled to an embedded memory unit for BIST testing.

FIG. 3 is a schematic block diagram of the present invention BIST circuit coupled to an embedded memory unit for BIST testing. In the following preferred embodiment, the invention is utilized, for example, to test an embedded memory device having a capacity of 128 Mb (megabits) and a word length of 256 bits. Since 128 Mb=$256 \times 2^{10} \times 2^9$, this embedded memory device can be accessed through a 10-bit row address, designated by [$AROW_1$, $AROW_2$, ... , $AROW_{10}$], and a 9-bit column address, designated by [$ACOL_1$, $ACOL_2$, ... , $ACOL_9$]. Moreover, the invention utilizes 8 probing pads for the memory tester to receive an error byte ERROR_BYTE 210 used to indicate the locations of bad memory cells in the embedded memory, if any; 1 probing pad for the memory tester to receive an error flag ERROR_FLAG 200 used to indicate that bad memory cell is detected, 2 probing pads for transferring the row and column address bits [$AROW_n$, $ACOL_n$] 220; and 2 probing pads for transferring end-address bits [$ENDROW_n$, $ENDCOL_n$] 230 used to indicate whether all the row and column addresses have been tested, where n represents the (n)th cycle of operation.

Figure 4:
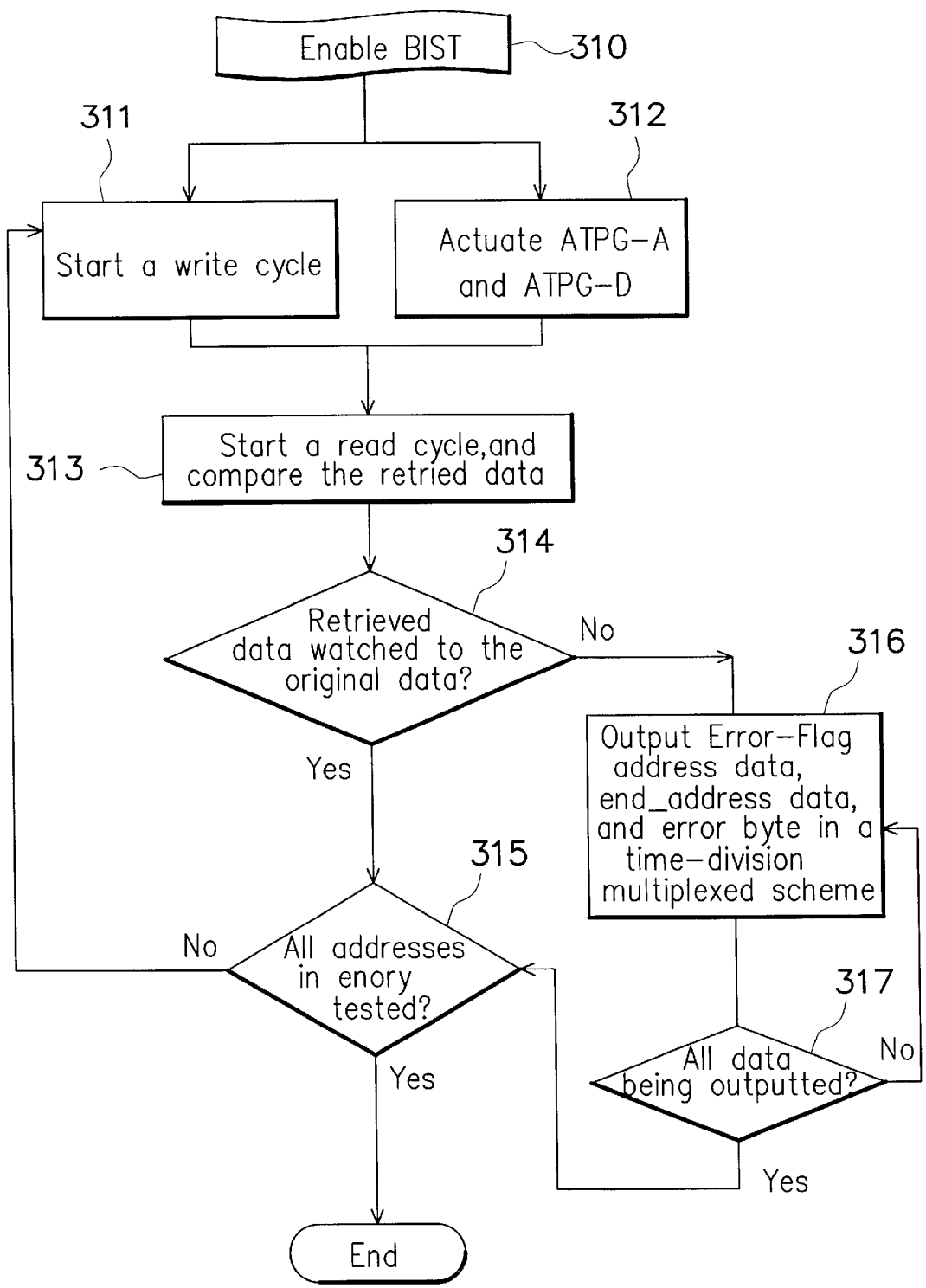
FIG. 4 is a flow diagram showing the steps involved in the BIST procedure performed by the method of the invention.

FIG. 4 is a flow diagram showing the procedural steps involved in the method according to the invention for performing a BIST procedure on the embedded memory.

As shown, in the initial step 310, the BIST procedure is enabled to test the embedded memory unit. At the initialization, the testing is performed under the clock rating of the embedded memory, which is higher than the clock rating of the memory tester.

In the step 311, the BIST procedure starts a write cycle; and meanwhile, in the step 312, the BIST procedure activates an ATPG_A unit 130 and an ATPG_D unit 140 to cause the ATPG_A unit 130 to generate an address signal and the ATPG_D unit 140 to generate a block of test data which are then stored into the embedded memory at the location specified by the ATPG_A unit 130.

In the step 313, the BIST procedure starts a read cycle, in which the previously-stored test data in the embedded memory 160 are retrieved from the embedded memory 160.

In the step 314, the BIST procedure utilizes a comparator to compare the retrieved data from the embedded memory 160 against the originally-generated data to check if any bit is incorrect. If all bits are correct, the procedure goes to the step 315; otherwise, if any bit is incorrect, the procedure goes to the step 316.

In the step 315. the BIST procedure checks whether all the memory cells have been tested. If NO, the procedure returns to the step 311; otherwise, the procedure is ended.

In the step 316, the BIST procedure first holds the ATPG_A unit 130 and the ATPG_D unit 140 at their current states, disables the high-speed clock rate, and latches all the bits in the retrieved test data from the embedded memory 160.

Then, the BIST procedure switches the operation to the clock rate provided by the memory tester, which is lower than the clock rating of the embedded memory being tested. Assume the memory location at the row address [00 1101 0100] and column address [1 0101 1001] contains bad memory cells, and assume that these bad memory cells are the 1st, 7th, and the 256th bits at this memory location. In response to this condition, the BIST procedure first sets the error flag ERROR_FLAG 200 to a value, for example 1, indicative of the detection of bad memory cells. It is a characteristic feature of the invention that a time-division multipexed scheme is utilized to transfer the 256 bits via the 8 probing pads 210 over 32 cycles to the memory tester.

As mentioned earlier, upon the detection of bad memory cells, the system clock rate is switched from the high-speed clock rate of the embedded memory to the low-speed clock rate of the memory tester. This low-speed clock rate is used to fetch the information about which memory cells are bad in the embedded memory, as described in the following.

During the first cycle, the memory tester outputs ERROR_FLAG=1, [$AROW_1$, $ACOL_1$]=[0, 1], [$ENDROW_1$, $ENDCOL_1$]=[0, 0] (indicating that there are still untested row and column addresses in the embedded memory), and ERROR_BYTE=[1000 0010] (indicating that the 1st and 7th bits are bad).

During the second cycle, the memory tester outputs ERROR_FLAG=1, [$AROW_2$, $ACOL_2$]=[0, 0], [$ENDROW_2$, $ENDCOL_2$]=[0, 0] (indicating that there are still untested addresses), and ERROR_BYTE=[0000 0000] (indicating that the 9th through 16th bits are all good).

During the third cycle, the memory tester outputs ERROR_FLAG=1, [$AROW_3$, $ACOL_3$]=[0, 0], [$ENDROW_3$, $ENDCOL_3$]=[0, 0] (indicating that there are still untested addresses), and ERROR_BYTE=[0000 0000] (indicating that the 17th through 24th bits are all good).

And so forth, during the ninth cycle, the memory tester outputs ERROR_FLAG=1, [$AROW_9$, $ACOL_9$]=[0, 1], [$ENDROW_9$, $ENDCOL_9$]=[0, 1] (indicating that column addresses are all tested, but there are still untested row addresses), and ERROR_BYTE=[0000 0000] (indicating that the 64th through 72nd bits are all good).

During the tenth cycle, the memory tester outputs ERROR_FLAG=1, [$AROW_{10}$, $ACOL_{10}$]=[0, x] (where x represents a don't-care value), [$ENDROW_{10}$, $ENDCOL_{10}$]=[1, 1] (indicating that both row and column addresses are all tested), and ERROR_BYTE=[0000 0000] (indicating that the 73rd through 80th bits are all good).

And so forth, during the 32nd cycle, the memory tester outputs ERROR_FLAG=1, [$AROW_{32}$, $ACOL_{32}$]=[x, x] (where x represents a don't-care value), [$ENDROW_{32}$, $ENDCOL_{32}$]=[1, 1] (indicating that both row and column addresses are all tested), and ERROR_BYTE=[0000 0001] (indicating that the 249th through 255th bits are all good, but the 256th bit is bad).

Subsequently during the 33rd cycle, the BIST procedure resets the error flag ERROR_FLAG to 0. Next, the BIST procedure switches the system clock rate from the low-speed clock rate of the memory tester back to the high-speed clock rate of the embedded memory system clock rate is switched from the high-speed clock rate of the embedded memory so as to allow the ATPG_A unit and the ATPG_D unit to operate at the high-speed clock rate.

The foregoing procedure is repeated until all the memory cells in the embedded memory are tested. When the BIST procedure is completed, all the bad memory cells are registered in the memory tester. The test engineer can utilize these data for analysis and repair of the bad memory cells in the embedded memory.

In conclusion, the invention provides a new method for performing a BIST procedure on embedded memory. The invention is characterized in the use of a time-division multipexed scheme to obtain the addresses of bad memory cells so that these address data can be used to indicate the locations of the bad memory cells during repair process.

Moreover, the invention is characterized in that it requires only a fewer number of probing pads than the prior art so that the required layout area for the BIST procedure can be reduced as compared to the prior art. The invention is therefore more cost-effective to implement than the prior art.

The invention has been described using exemplary preferred embodiments. How-ever, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for performing a BIST procedure on an embedded memory device having a specific word length, comprising the steps of:
   (1) generating a block of test data;
   (2) performing a write operation to write the test data into a specified address in the embedded memory;
   (3) performing a read operation to retrieve the test data from the embedded memory;
   (4) comparing the retrieved test data with the originally-generated test data in the step (1); and
   (5) if any bit is mismatched, outputting a sequence of blocks of error bits indicative of the bad memory cells in the embedded memory, if any; the length of each error-bit block being an integer division of the word length of the embedded memory, and the sequence of error-bit blocks being transferred in a time-division multipexed scheme via a plurality of probing pads equal in number to the length of the error-bit block.

2. The method of claim 1, wherein in the step (1), an ATPG_A unit is used to generate the test data.

3. The method of claim 1, wherein in the step (2), an ATPG_D unit is used to generate the specified address.

4. The method of claim 1, wherein the steps (1) through steps (4) are performed under a first clock rate, while the step (5) is performed under a second clock rate which is lower than the first clock rate.

5. The method of claim 4, wherein the first clock rate is equal to the clock rating of the embedded memory.

6. The method of claim 5, wherein the second clock rate is equal to the clock rating of a memory tester used to perform the BIST procedure.

7. The method of claim 6, wherein the switching between the first clock rate and the second clock rate is controlled by an error flag, in such a manner that the disabling of the error flag causes the switching to the first clock rate; and the enabling of the error flag causes the switching to the second clock rate.

8. The method of claim 7, wherein the number of probing pads used to transfer each block of error bits is 8.

9. The method of claim 1, wherein in the step (5), each error-bit block is 8 bits in length.

10. The method of claim 1, wherein the step (5) further comprising the substep of:
    outputting a set of end-address bits together with each block of error bits, indicative of whether all the addresses in the embedded memory have been tested.

* * * * *